(12) United States Patent
Gustavsson

(10) Patent No.: US 8,072,264 B2
(45) Date of Patent: Dec. 6, 2011

(54) AMPLIFYING DEVICE

(75) Inventor: Ulf Gustavsson, Gothenburg (SE)

(73) Assignee: Telefonaktiebolaget L M Ericsson (publ) (SE)

( * ) Notice: Subject to any disclaimer, the term of this patent is extended or adjusted under 35 U.S.C. 154(b) by 0 days.

(21) Appl. No.: 12/680,048

(22) PCT Filed: Oct. 26, 2007

(86) PCT No.: PCT/SE2007/050785
§ 371 (c)(1),
(2), (4) Date: Mar. 25, 2010

(87) PCT Pub. No.: WO2009/054765
PCT Pub. Date: Apr. 30, 2009

(65) Prior Publication Data
US 2010/0201441 A1    Aug. 12, 2010

(51) Int. Cl.
*H03F 3/68* (2006.01)
(52) U.S. Cl. .................... 330/124 R; 330/295
(58) Field of Classification Search .............. 330/124 R, 330/295
See application file for complete search history.

(56) References Cited

U.S. PATENT DOCUMENTS

| | | | |
|---|---|---|---|
| 3,927,379 A * | 12/1975 | Cox et al. ................... | 330/10 |
| 2003/0137346 A1 | 7/2003 | Hellberg | |
| 2004/0135630 A1 | 7/2004 | Hellberg | |
| 2006/0114060 A1 | 6/2006 | Hellberg et al. | |

FOREIGN PATENT DOCUMENTS

| | | |
|---|---|---|
| JP | 9-74320 A | 3/1997 |
| JP | 2006-140911 A | 6/2006 |
| WO | WO 2005/031966 A1 | 4/2005 |

OTHER PUBLICATIONS

"Efficiency of Outphasing RF Power-Amplifier Systems," F. Raab, IEEE Transactions on Communications, vol. COM-33, No. 10, Oct. 1985, pp. 1094-1099.
Official Action with English language translation, JP Application No. 2010-530954, Aug. 9, 2011.

* cited by examiner

*Primary Examiner* — Robert Pascal
*Assistant Examiner* — Khiem Nguyen
(74) *Attorney, Agent, or Firm* — Myers Bigel Sibley & Sajovec, P.A.

(57) ABSTRACT

The present invention concerns a composite amplifier and a method for controlling the amplitude of a composite amplifier in a node of a wireless communication system. The composite amplifier comprises a first amplifier and a second amplifier that are arranged to be connected via an output combiner network to a load. The method comprises decomposing an input signal into a first signal component and a second signal component. Further, the method comprises differentiating the amplitude on the first signal component from the amplitude on the second signal component. the differentiation is made such that the aggregated efficiency of the composite amplifier is increased. The present invention also concerns a radio transmission device comprising a composite amplifier.

6 Claims, 5 Drawing Sheets

AMPLIFYING DEVICE

TECHNICAL FIELD

The present invention relates to the field of amplifiers. More particularly the present invention relates to a composite amplifier as well as a method for controlling the amplitude of a composite amplifier.

BACKGROUND

The rapid development of the telecommunications industry have made wireless handheld devices like cell phones, pagers, two-way messaging devices, etc. massively popular, creating a need for new electronic components and circuits in both mobile and base station systems as competition drives the introduction of expanded capabilities.

For wireless handsets, wireless PDAs (Personal Digital Assistants), and other wireless devices, one overarching concern is power consumption; the less power a device consumes the more desirable it is. Thus higher efficiency components, such as amplifiers, are desirable in these wireless devices.

Radio frequency power amplifiers contribute to the power consumption in the communications systems. To extend battery life in mobile units, and to reduce operating costs of base stations, there is a need to develop new amplifiers to replace inefficient, power wasting, elderly designs currently in use.

Many contemporary base station amplifiers employ complex techniques to realize amplifiers with a high degree of linearity over a broad frequency range. Unfortunately those solutions have a low efficiency.

Handset power amplifiers also suffer from efficiency problems, often more critical than those for base stations as the power supply for mobile user equipment is strictly limited. Today's smaller, faster and more effective portable electronics demand high power with only little losses.

Switching mode amplifiers have been used for quite some time in various electronic systems including audio power amplifiers and switching power supply circuits. In switching mode amplifiers, the transistor is operated as a switch. Switching mode amplifiers suffer however from the existence of some fundamental limits, such as large parasitic capacitance, which may prevent many transistors from working well at high power and frequency.

Modulation schemes incorporating an amplitude component is a technique used in electronic communication, most commonly for transmitting information via a radio carrier wave. Amplitude modulation works by varying the strength of the transmitted signal in relation to the information being sent. For example, changes in the signal strength can be used to reflect the sounds to be reproduced by a speaker. Unfortunately, amplifiers loose efficiency when working in backed of power operation i.e. working below full effect, why they at present are unsuitable to be used for amplitude modulation of a radio signal. Thus there is a problem with efficiency in back off.

One type of architecture to circumvent this is the so called Linear amplification using Nonlinear Components (LINC) or the Chireix architecture. These techniques are commonly known as outphasing which involves two signals which are separated by a common phase angle and recombined in a combiner or combining network. By adjusting the said phase of the two signals, the combined resulting signal presents an amplitude component with amplitude proportional to the said phase difference. This technique enables the use of saturated amplifiers or switching amplifiers to create modulation schemes with amplitude components. Unfortunately, field tests have resulted in far from ideal results, as the resulting circuits were found to be insufficiently efficient, especially in backed of power operation. Also, an uneven workload between the branches shows up when the output power is controlled by altering the outphasing angle. The efficiency is degraded by unwanted power dissipation caused by collisions between the intrinsic drain-voltage and -current.

Based on the above, there is a need for methods or circuits which overcome or mitigate at least some of the drawbacks of the known amplifiers.

SUMMARY

The present invention aims at obviating or reducing at least some of the above mentioned disadvantages associated with existing technology.

It is an object of the present invention to provide a composite amplifier with an improved efficiency.

The object is achieved by a method for controlling the amplitude of a composite amplifier in a node of a wireless communication system. The composite amplifier comprises a first amplifier and a second amplifier that are arranged to be connected via an output combiner network to a load. The method comprises decomposing an input signal into a first signal component and a second signal component. Further, the method comprises differentiating the amplitude on the first signal component from the amplitude on the second signal component. The differentiation is made such that the aggregated efficiency of the composite amplifier is increased.

In accordance with the present invention, the object is also achieved by a composite amplifier for use in a node of a wireless communication system. The composite amplifier comprises a first amplifier and a second amplifier. The first amplifier and the second amplifier are arranged to be connected via an output combiner network to a load. The first amplifier and the second amplifier are configured to be asymmetrically controlled. The configuration is performed such that the amplitude on the first amplifier is differentiated from the amplitude on the second amplifier.

The composite amplifier may with advantage be provided in a radio transmission device such as a wireless access point or a wireless terminal.

Since the amplitude on the first amplifier, which has a good efficiency in power back off is differentiated from the amplitude on the second amplifier, which has a bad efficiency in power back off, by being increased in comparison to the amplitude on the second amplifier, the resulting efficiency of the composite amplifier is increased. Thus the overall capacity of a wireless communication system is increased.

An advantage of the present device is that an improved efficiency is reached, in particular in backed off power operation, which saves energy resources.

BRIEF DESCRIPTION OF THE DRAWINGS

The present invention will now be described more in detail in relation to the enclosed drawings, in which.

DETAILED DESCRIPTION

The invention is defined as a composite amplifier which may be put into practice in the embodiments further described below.

Figure 1:
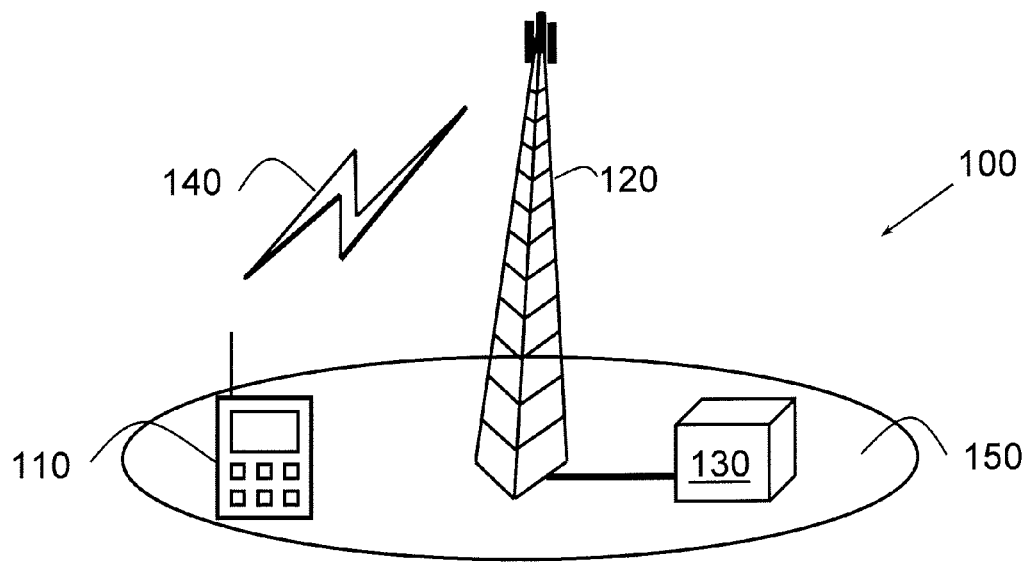
FIG. 1 is a block diagram illustrating embodiments of a wireless communication network.

FIG. 1 depicts a first node 120 communicating with a second node 110 in a wireless communication system 100. The communication between the first node 120 and the second node 110 is made over a radio link 140 in a cell 150 comprised in the wireless communication system 100. The wireless communication system 100 also comprises a radio network controller 130.

The first node 120 and the second node 110 may both be referred to as radio transmission devices. In some embodiments, the first node 120 may be a base station, a wireless communications station, a fixed station, a control station, a repeater or any similar arrangement for radio communication. The second node 110 may in some embodiments be a user equipment such as a mobile cellular radiotelephone, a Personal Digital Assistant (PDA), a laptop, a computer or any other kind of device capable of communicate radio resources.

The wireless communication system 100 may be based on technologies such as e.g. Code division multiple access (CDMA), Wideband Code Division Multiple Access (WCDMA), CDMA 2000, High Speed Downlink Packet Data Access (HSDPA), High Speed Uplink Packet Data Access (HSUPA), High Data Rate (HDR) etc.

Any or both of the radio transmission devices 110, 120 may comprise at least one composite amplifier for asymmetric amplification of signals according to the inventive solution. The radio transmission devices 110, 120 may e.g. be a wireless access point 120 or a wireless terminal 110.

Figure 2A:
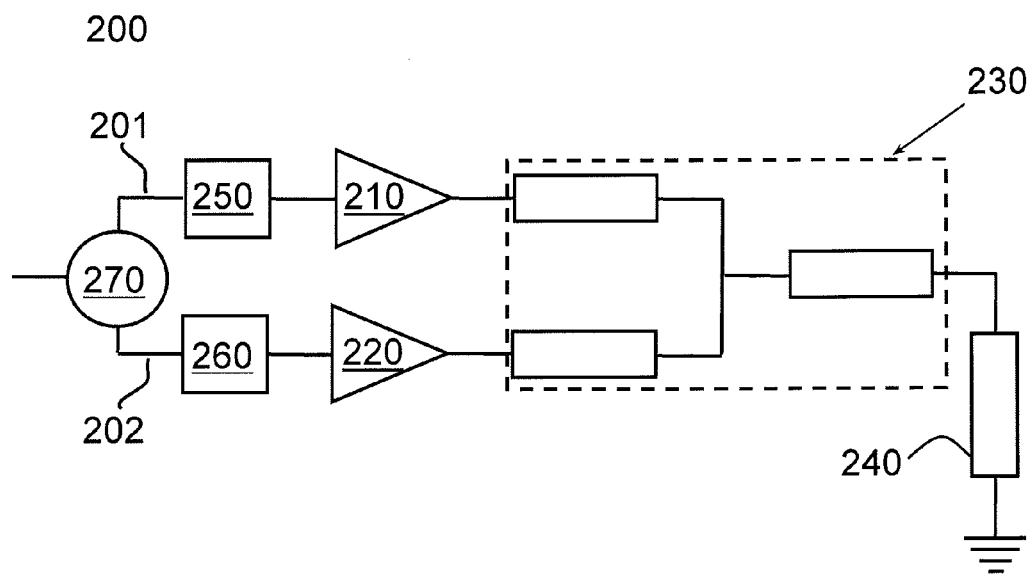
FIG. 2a is a block diagram illustrating embodiments of a composite amplifier.

FIG. 2a illustrates a composite amplifier 200 according to the present invention. The composite amplifier 200 is arranged to receive an input signal. The composite amplifier 200 may according to some embodiments be adapted to perform linear amplification of non linear components, sometimes referred to as a LINC composite amplifier. The composite amplifier 200 may according to some embodiments be a Chireix type composite amplifier.

The composite amplifier 200 comprises two amplifiers 210 and 220. These amplifiers 210, 220 are sometimes referred to as branch amplifiers, and they are combined in the composite amplifier 200 to create a single signal of varying phase and amplitude. The composite amplifier 200 also comprises at least two branches 201, 202. According to some embodiments, the first branch 201 comprises the first amplifier 210 and the second branch 202 comprises the second amplifier 220.

The amplifiers 210 and 220 may be embodied by any arbitrary type of amplifiers. The amplifiers 210 and 220 may even be embodied by amplifiers of different types.

The composite amplifier 200 further comprises a control unit 270. The control unit 270 may be configured to decompose the input signal into a first signal component and a second signal component. Further, the control unit 270 may be configured to the phase shift the outphasing angle $\phi(t)$, such that if the phase on the first branch 201 is $\pm\phi(t)$, the phase on the second branch 202 is $\mu\phi(t)$. The total difference in phase may be e.g. between 0 and 180 degrees. As a non limiting example, the phase shift may be 180 degrees, according to some embodiments. By altering the differential phase-shift between the two amplifiers 210 and 220, amplitude modulation is created.

The impedance presented to each amplifier 210, 220 is partially determined by the differential outphasing angle $\phi(t)$. When altering this angle $\phi(t)$, the reactive part of the load impedance on each branch 201, 202 will move in either along the positive or negative axis of the load Z-plane.

Further, the composite amplifier 200 according to the present solution comprises amplitude differentiation devices 250, 260, e.g. one amplitude differentiation device 250, 260 on each branch 201, 202. According to some embodiments, each amplitude differentiation device 250, 260 uses a non-linear function in order to differentiate the amplitude on the signal component which is supplied to the first amplifier 210 from the amplitude on the signal component which is supplied to the second amplifier 220, as will be explained in detail later.

Further, the composite amplifier 200 comprises a combining network 230, which is adapted to combine the signals received from the two amplifiers 210 and 220 and create a single signal. The signal may then be supplied to a load 240.

This may be illustrated by an example. Assume the input signal $E(t)\cos(\omega t+\theta(t))$ is supplied to the control unit 270. $E(t)$ is the envelope signal, $\theta(t)$ is the phase and w is the carrier frequency. This signal is decomposed by the control unit 270 into two signal components with equal envelope amplitude, but with phase shifted outphasing angles:

First signal component, supplied on the first branch 201:

$$\frac{\hat{E}}{2}\cos(\omega t + \theta(t) + \varphi(t))$$

Second signal component, supplied on the second branch 202:

$$\frac{\hat{E}}{2}\cos(\omega t + \theta(t) - \varphi(t))$$

where $$\varphi(t) = \arcsin\left(\frac{E(t)}{\hat{E}}\right)$$

is the outphasing angle and $\hat{E}$ is the maximum amplitude.

The first signal component, supplied on the first branch 201 then passes the first amplitude differentiation device 250. The amplitude differentiation device 250 processes the amplitude of the first signal component through a first non-linear function, $f(x)$ such that $A(t)=f(E(t))$. The made amplitude differentiation result in the first signal component $A(t)\cos(\omega t+\theta(t)+\phi(t))$, which may be supplied to the first amplifier 210.

Correspondingly, the second signal component, supplied on the second branch 202 then passes the second amplitude differentiation device 260. The second amplitude differentiation device 260 then processes the amplitude of the second signal component through a second non-linear function, $g(x)$ such that $B(t)=g(E(t))$. The made amplitude differentiation result in the differentiated signal component $B(t)\cos(\omega t+\theta(t)-\phi(t))$, which may be supplied to the second amplifier 220.

These signal components are thus not constant envelope signals.

Figure 2B:
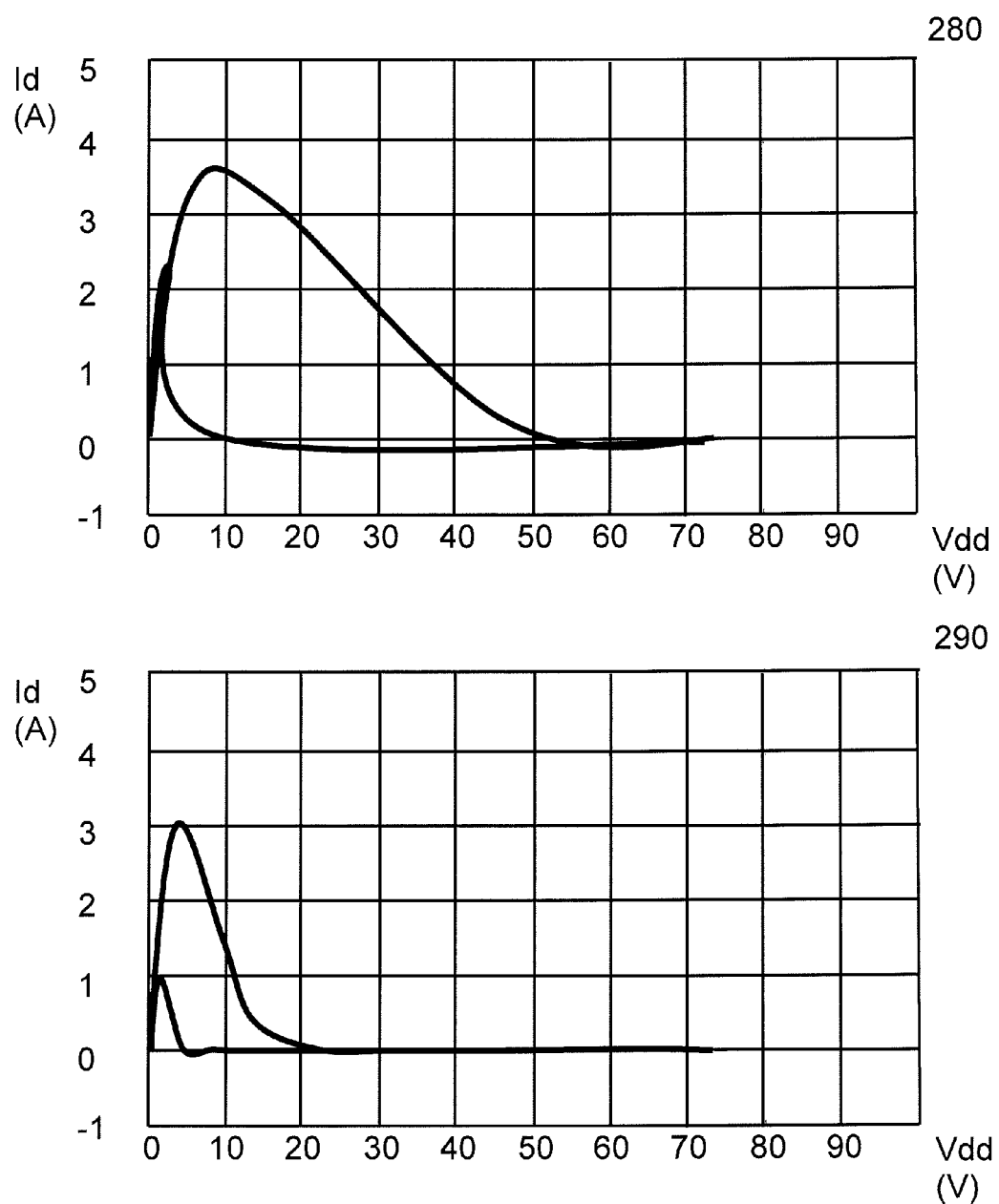
FIG. 2b is a diagram illustrating the load-lines of the branch amplifiers.

FIG. 2b is two diagrams illustrating the load-lines of the branch amplifiers. In diagram 280 is the load line on the negative side depicted and in diagram 290 is the load line on the positive side depicted. When comparing diagram 280 and 290, it is clear that there is a larger voltage current overlap in diagram 280, which leads to efficiency loss e.g. in form of heat.

As the first amplifier 210 and the second amplifier 220 have different efficiency in power back off, the resulting efficiency of the composite amplifier 210, 220 may be increased by increasing the amplitude on the signal component of the amplifier 210, 220 with good efficiency in relation to the amplitude on the signal component of the amplifier 210, 220 with bad efficiency.

The impedance presented to each amplifier 210, 220 is partially determined by the amplitude asymmetry introduced using the non-linear functions f(x) and g(x), in order to improve the aggregated system efficiency.

According to some embodiments, the amplitude- and phase functions mentioned above may be defined by:

$$A[k(t)] = 1 - \left(\frac{2\arcsin(k(t))}{\pi}\right)^{N1}$$

$$B[k(t)] = 1 - \left(\frac{2\arcsin(k(t))}{\pi}\right)^{N2}$$

$$\varphi[k(t)] = \arcsin(k(t))$$

Where $N_1$ and $N_2$ are the scaling factors and k(t) is the variable describing the normalized voltage amplitude, ranging between 0 and 1.

An alternative according to some embodiments is to keep the outphasing angle φ(t) fixed for lower amplitudes, such that φ(t) is hold constant after a certain envelope amplitude level, predetermined angle φk. Thus:

$$A[k(t)] = 1 - \left(\frac{2\arcsin(k(t))}{\pi}\right)^{N1}$$

$$B[k(t)] = 1 - \left(\frac{2\arcsin(k(t))}{\pi}\right)^{N2}$$

$$\varphi[k(t)] = \begin{cases} \arcsin(k(t)) & \text{for } \varphi < \varphi k \\ \varphi k & \text{for } \varphi \geq \varphi k \end{cases}$$

The definition for A(t) and B(t) are the same as for the above presented algorithm. The difference is that amplitudes smaller than [A(t)+B(t)] cos(φk) is completely controlled by A(t) and B(t), while φ(t) is constant.

The described algorithms are mentioned as non limiting examples only. The invented method is by no means limited to these algorithms, the amplitude- and phase functions may as well be set by another algorithm or e.g. by a look up table.

Figure 2C:
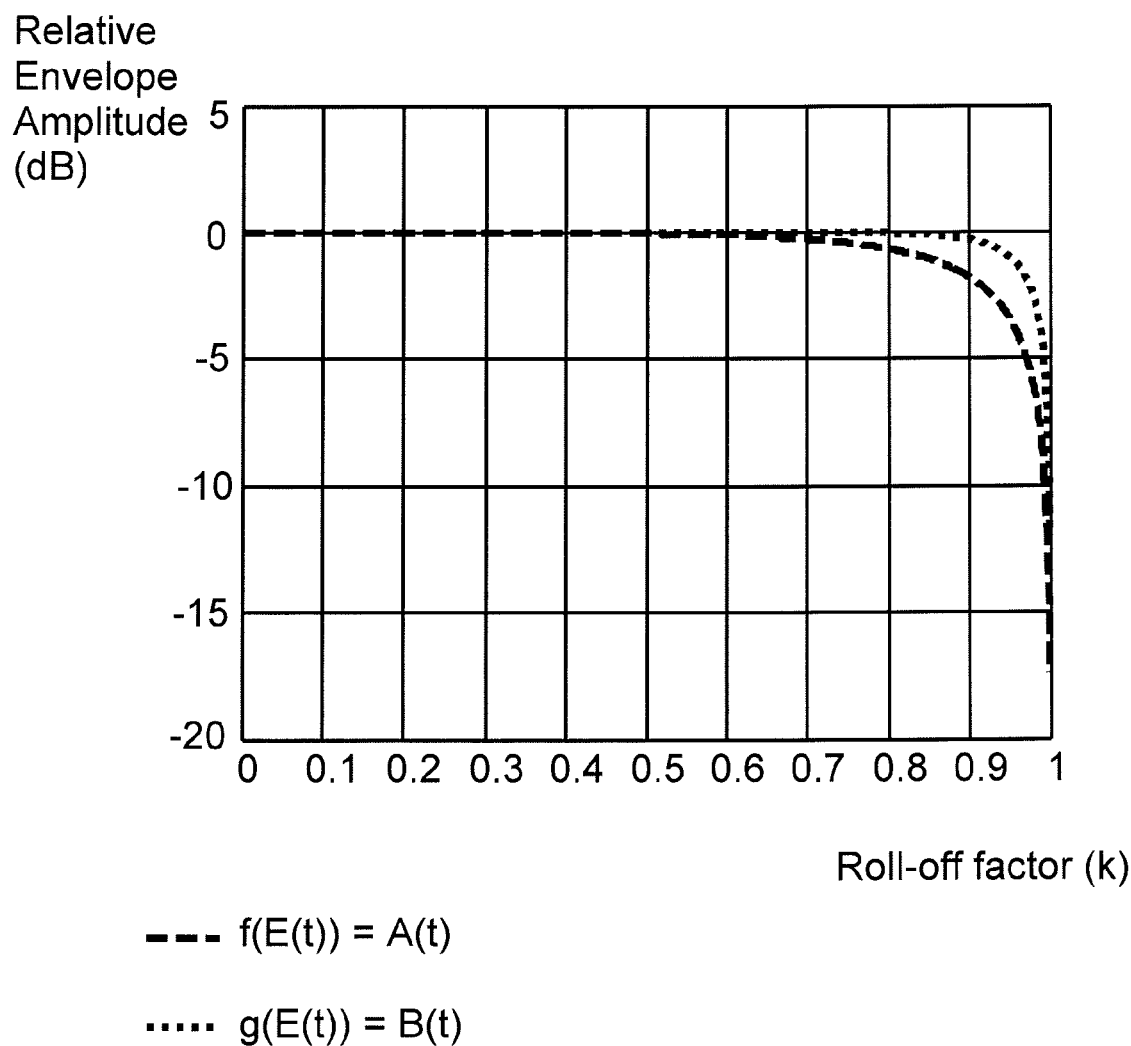
FIG. 2c is a diagram illustrating non linear functions according to an embodiment of the method.

Examples of non-linear functions f and g are illustrated in FIG. 2c, where the envelope amplitude as a function of the roll off factor k is illustrated for each function f and g, respectively. Maximum output amplitude is represented by 0 dB.

After having been amplitude differentiated, the first signal component is supplied to the first amplifier 210 and the second signal component is supplied to the second amplifier 220. In each amplifier 210, 220, each signal component is amplified with a factor K. Thereafter, the signal components are recombined in the combiner network 230 such that:

$$K \cdot A(t)\cos(\omega t + \theta(t) + \varphi(t)) + K \cdot B(t)\cos(\omega t + \theta(t) - \varphi(t)) =$$

$$K \cdot \underbrace{[A(t) + B(t)]\cos(\omega t + \theta(t))\cos(\varphi(t))}_{\text{Wanted term}} +$$

$$K \cdot \underbrace{[A(t) - B(t)]\sin(\omega t + \theta(t))\sin(\varphi(t))}_{\text{Extra spectral term}}$$

Wherein: [A(t)−B(t)] sin(ωt+θ(t))sin(φ(t)) is an unwanted extra spectral term created by the amplitude asymmetry. The extra spectral term which may be removed by using a suitable pre-distortion, which also incorporates compensation for non-linearity's in the power amplifiers 210, 220.

Further, assuming that |A(t)+B(t)|>>|A(t)−B(t)|, the extra spectral term may be small enough to neglect. If not, the extra term may be predictable enough to cancel out by using a suitable pre-distortion method. In the case of keeping the outphasing angle fixed after a certain output power back off operation, the unwanted spectral component may be kept to a minimum.

The control unit 270 may according to some embodiments be configured to pre distort the extra spectral term that may result from the differentiation of amplitudes on the branch amplifiers 210, 220 by using a suitable pre-distortion method. An example of such suitable pre-distortion method may be to add the term −0.5·[A(t)−B(t)] sin(ωt+θ(t))sin(φ(t)) at each branch.

The output signal may then be supplied to the load 240.

The composite amplifier 200 may be used advantageously for wireless communication in different communication situations in wireless networks 100.

The composite amplifier 200 as herein described may with certain advantage be provided e.g. in a wireless access point, such as e.g. a base station, a wireless communications station, a fixed station, a control station, a repeater or a similar arrangement for communication.

The composite amplifier 200 as herein described may however alternatively be provided in an arbitrary electronic device wherein there is a need of amplification of signals, such as a hearing aid, wireless speakers, notebook computers, walkie-talkies, hunting radios, baby monitors etc.

Figure 3:
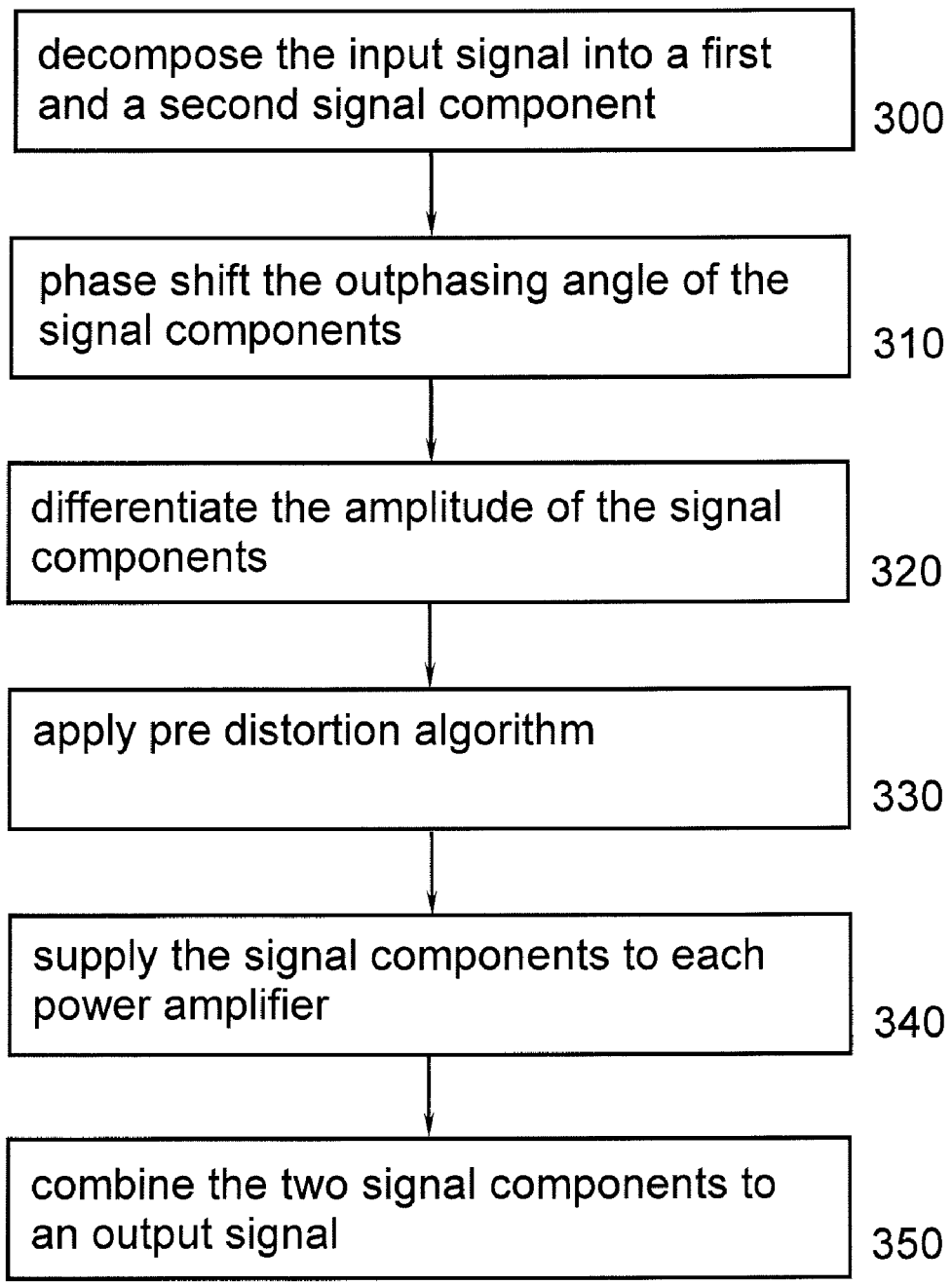
FIG. 3 is a flow chart illustrating embodiments of method steps.

FIG. 3 is a flow chart illustrating a method for controlling the amplitude of a composite amplifier 200 in a node 120 of a wireless communication system 100. The composite amplifier 200 comprises a first amplifier 210 and a second amplifier 220. The first amplifier 210 and the second amplifier 220 are arranged to be connected via an output combiner network 230 to a load 240.

The method may be generalized for any set of 2·n amplifiers 210, 220 comprising outphasing-type modulation methods, where n is an arbitrary positive integer. However, the method is further described in detail for the case of two branch amplifiers 210, 220, in order to simplify the readers understanding of the principles of the present method.

To appropriately adjust the amplitudes of the branch amplifiers 210 and 220 respectively, the method may comprise a number of steps 300-350. It is however to be noted that some of the described method steps are optional and only comprised within some embodiments. Further, it is to be noted that the method steps 300-350 may be performed in any arbitrary chronological order and that some of them, e.g. step 310 and step 330, or even all steps may be performed simultaneously or in an altered or even reversed chronological order.

Step 300

Decomposing an input signal into a first signal component and a second signal component.

Thus an input signal, e.g. E(t)cos(ωt+θ(t)), where E(t) is the envelope signal, θ(t) is the phase and w is the carrier frequency is decomposed into two signal components with equal envelope amplitude and outphasing angle. First signal component, supplied on the first branch 201:

$$\frac{\hat{E}}{2}\cos(\omega t + \theta(t) + \varphi(t)).$$

Second signal component, supplied on the second branch 202:

$$\frac{\hat{E}}{2}\cos(\omega t + \theta(t) - \varphi(t)),$$

where $$\varphi(t) = \arcsin\left(\frac{E(t)}{\hat{E}}\right)$$

is the outphasing angle and Ê is the maximum amplitude.

Step 310

Phase shifting the outphasing angle of the first signal component and the second signal component. In this method step 310 the outphasing angle φ(t) is phase shifted, such that if the phase of the first signal component on the first branch 201 is ±φ(t), the phase of the second signal component on the second branch 202 is μφ(t). By altering the differential phase-shift between the two amplifiers 210 and 220, amplitude modulation is created.

Step 320

Differentiating the amplitude on said first signal component from the amplitude on said second signal component such that the aggregated efficiency of the composite amplifier 200 is increased. In step 320, the amplitude on the first amplifier 210 is differentiated from the amplitude on the second amplifier 220 such that the aggregated efficiency of the composite amplifier 200 is increased.

Step 330

Pre distorting an extra spectral term that may result from the step of differentiation 320.

The extra spectral term [A(t)−B(t)] sin(ωt+θ(t))sin(φ(t)) is an unwanted extra spectral term created by the amplitude asymmetry. The extra spectral term may be removed by using a suitable pre-distortion, which also incorporates compensation for non-linearity in the power amplifiers 210, 220. Thus it may be cancelled out by using a suitable pre-distortion method. An example of a suitable pre-distortion method may be e.g. to cancelling the term by adding: −0.5·[A(t)−B(t)] sin(ω_c t+θ(t))sin(φ(t)), in advance.

Step 340

Supplying the first signal component to the first amplifier 210 and the second signal component to the second amplifier 220.

Step 350

Combining the two signal components to an output signal after each signal has passed their respective power amplifier.

The signal may then according to some embodiments be provided via an output combiner network 230 to a load 240.

Figure 4:
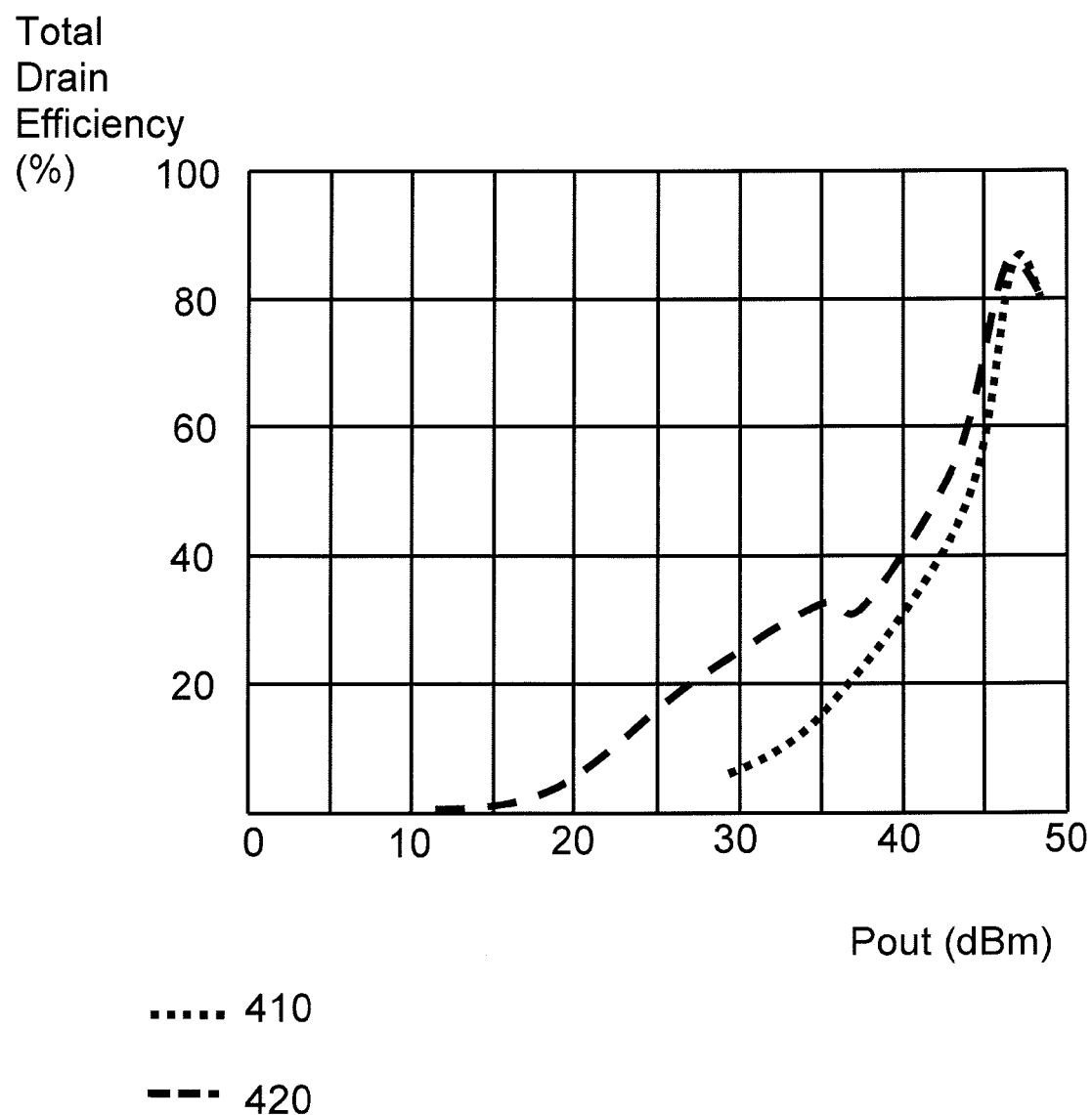
FIG. 4 is a diagram illustrating total drain efficiency versus output power.

FIG. 4 is a diagram illustrating total drain efficiency versus output power of the composite amplifier 200. By differentiating 320 the amplitude on the first amplifier 210 from the amplitude on the second amplifier 220, the efficiency in back off may be improved, as illustrated in FIG. 4. 410 illustrate the efficiency of the regular outphasing and 420 illustrate asymmetrically controlled drive signals with fixed differential outphasing angle.

Efficiency in back off denotes efficiency when a composite amplifier 200 is used below its maximum available output power. Back off is the difference in decibels between actual used output power and the maximum available output power of the composite amplifier 200.

The asymmetrically controlled composite amplifier 200, illustrated by 410, performs better compared to the symmetrically controlled composite amplifier 420 from approximately Pmax−8 dB and below. This would provide vast improvements on the overall efficiency. At 18 dB backed off output power, the efficiency is improved by more than 20% by using an asymmetrically controlled composite amplifier 200, compared to regular outphasing 420.

The method for controlling the amplitude of a composite amplifier 200 according to the present solution may be implemented through one or more processors, together with computer program code for performing the functions of the method. The program code mentioned above may also be provided as a computer program product, for instance in the form of a data carrier carrying computer program code for performing the method according to the present invention when being loaded into a processor comprised within the base station 120 and/or the user equipment 110. The data carrier may be a CD ROM disc, a memory stick, or any other medium such as a disk or tape that can hold machine readable data. The computer program code may furthermore be provided as pure program code on a server and downloaded to the base station 120 and/or user equipment 110 remotely.

Computer program code for carrying out operations for controlling the amplitude of a composite amplifier 200 discussed herein may be written in a high-level programming language, such as Java, C, and/or C++, for development convenience. In addition, computer program code for carrying out operations of embodiments of the present invention may also be written in other programming languages, such as, but not limited to, interpreted languages. Some modules or routines may be written in assembly language or even microcode to enhance performance and/or memory usage. It will be further appreciated that the functionality of any or all of the program modules also may be implemented using discrete hardware components, one or more application specific integrated circuits (ASICs), or a programmed digital signal processor or microcontroller.

While the composite amplifier 200 described in this document is susceptible to various modifications and alternative forms, specific embodiments thereof are shown by way of example in the drawings and are herein described in detail. It should be understood, however, that there is no intent to limit the present composite amplifier 200 to the particular forms disclosed, but on the contrary, the present device is to cover all modifications, equivalents, and alternatives falling within the spirit and scope of the composite amplifier 200 and method in a composite amplifier 200 as defined by the claims.

Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present.

Furthermore, "connected" or "coupled" as used herein may include wirelessly connected or coupled. As used herein, the term "and/or" includes any and all combinations of one or more of the associated listed items.

Unless otherwise defined, all terms including technical and scientific terms used herein have the same meaning as commonly understood by a person of ordinary skill in the art to which these methods and arrangements belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. Method for controlling an amplitude of a composite amplifier in a node of a wireless communication system, said composite amplifier comprising a first amplifier and a second amplifier that are arranged to be connected via an output combiner network to a load, the method comprising:
    decomposing an input signal into a first signal component and a second signal component,
    phase shifting at least one of the first signal component and the second signal component to generate first and second phase differentiated signal components;
    differentiating an amplitude of the first and second phase differentiated signal components to generate first and second phase-amplitude differentiated signal components;
    generating a pre-distortion signal responsive to a difference between amplitudes of the first and second phrase-amplitude differentiated signal components;
    combining the pre-distortion signal with each of the first and second phase-amplitude differentiated signal components to generate first and second compensated signal components; and
    supplying the first compensated signal component to the first amplifier and the second compensated signal component to the second amplifier.

2. Method according to claim 1, further comprising:
    combining the first compensated signal component and the second compensated signal component to form an output signal.

3. Composite amplifier for use in a node of a wireless communication system, said composite amplifier comprising:
    a control unit configured to decompose an input signal into a first signal component and a second signal component, to phase shift at least one of the first signal component and the second signal component to generate first and second phase differentiated signal components, to differentiate an amplitude of the first and second phase differentiated signal components to generate first and second phase-amplitude differentiated signal components, to generate a pre-distortion signal responsive to a difference between amplitudes of the first and second phase-amplitude differentiated signal components, and to combine the pre-distortion signal with each of the first and second phase-amplitude differentiated signal components to generate first and second compensated signal components;
    a first amplifier that is connected to amplify the first compensated signal component;
    a second amplifier that is connected to amplify the second compensated signal component; and
    an output combiner network configured to combine the amplified first and second compensated signal components for supply to a load.

4. Radio transmission device comprising:
    at least one composite amplifier that comprises:
        a control unit configured to decompose an input signal into a first signal component and a second signal component, to phase shift at least one of the first signal component and the second signal component to generate first and second phase differentiated signal components, to differentiate an amplitude of the first and second phase differentiated signal components to generate first and second phase-amplitude differentiated signal components, to generate pre-distortion signal responsive to a difference between amplitudes of the first and second phase-amplitude differentiated signal components, and to combine the pre-distortion signal with each of the first and second phase-amplitude differentiated signal components to generate first and second compensated signal components;
        a first amplifier that is connected to amplify the first compensated signal component;
        a second amplifier that is connected to amplify the second compensated signal component; and
        an output combiner network configured to combine the amplified first and second compensated signal components for supply to a load.

5. Radio transmission device according to claim 4, where the radio transmission device is a wireless access point, and the load comprises an antenna of the wireless access point.

6. A radio transmission device according to claim 4, where the radio transmission device is a wireless terminal, and the load comprises an antenna of the wireless terminal.

* * * * *

UNITED STATES PATENT AND TRADEMARK OFFICE
CERTIFICATE OF CORRECTION

PATENT NO. : 8,072,264 B2
APPLICATION NO. : 12/680048
DATED : December 6, 2011
INVENTOR(S) : Gustavsson Page 1 of 1

It is certified that error appears in the above-identified patent and that said Letters Patent is hereby corrected as shown below:

On the Title Page, in item (56), under "U.S. PATENT DOCUMENTS",
in Column 1, insert -- 6,751,265 B1 6/2004 Schell et al. --.

On the Title Page, in item (56), under "FOREIGN PATENT DOCUMENTS",
in Column 2, insert -- WO 2007/078217 A1 7/2007, WO 01/91282 A2 11/2001 --.

On the Title Page, in item (56), under "OTHER PUBLICATIONS", in Column 2,
insert -- Communication with supplementary European Search Report, EPO Application No.
07 83 5369, 10-04-2011, Communication pursuant to Article 94(3) EPC, EPO Application 07
83 5369, 10-04-2011 --.

On the Title Page, in item (57), under "ABSTRACT", in Column 2, Line 10,
delete "component. the" and insert -- component. The --, therefor.

In Column 4, Line 22, delete "w" and insert -- $\omega$ --, therefor.

In Column 7, Line 8, delete "w" and insert -- $\omega$ --, therefor.

In Column 9, Lines 45-46, in Claim 1, delete "phrase-amplitude" and
insert -- phase-amplitude --, therefor.

In Column 10, Line 36, in Claim 4, delete "generate" and insert -- generate a --, therefor.

In Column 10, Line 50, in Claim 5, delete "4,where" and insert -- 4, where --, therefor.

In Column 10, Line 53, in Claim 6, delete "4,where" and insert -- 4, where --, therefor.

Signed and Sealed this
Twenty-ninth Day of January, 2013

David J. Kappos
*Director of the United States Patent and Trademark Office*